US008013640B1

(12) United States Patent
Chu

(10) Patent No.: US 8,013,640 B1
(45) Date of Patent: Sep. 6, 2011

(54) PROGRAMMABLE ULTRASOUND TRANSMIT BEAMFORMER INTEGRATED CIRCUIT AND METHOD

(75) Inventor: Ching Chu, San Jose, CA (US)

(73) Assignee: Supertex, Inc., Sunnyvale, CA (US)

( * ) Notice: Subject to any disclaimer, the term of this patent is extended or adjusted under 35 U.S.C. 154(b) by 298 days.

(21) Appl. No.: 12/484,107

(22) Filed: Jun. 12, 2009

Related U.S. Application Data

(60) Provisional application No. 61/073,850, filed on Jun. 19, 2008.

(51) Int. Cl.
*H03B 21/00* (2006.01)

(52) U.S. Cl. .................................. 327/106; 310/316.01

(58) Field of Classification Search .................. 327/106
See application file for complete search history.

(56) References Cited

U.S. PATENT DOCUMENTS

| | | | | |
|---|---|---|---|---|
| 4,849,872 | A * | 7/1989 | Gassler | 363/49 |
| 5,121,023 | A * | 6/1992 | Abel | 310/316.01 |
| 5,436,521 | A * | 7/1995 | Kataoka | 310/317 |
| 5,895,983 | A * | 4/1999 | Motomura | 307/106 |
| 6,265,809 | B1 * | 7/2001 | Fujii et al. | 310/317 |
| 2003/0222535 | A1 * | 12/2003 | Gofman et al. | 310/316.01 |
| 2006/0092677 | A1 * | 5/2006 | Moussaoui et al. | 363/71 |
| 2007/0027508 | A1 * | 2/2007 | Cowan | 607/61 |

* cited by examiner

*Primary Examiner* — Lincoln Donovan
*Assistant Examiner* — Ryan Jager
(74) *Attorney, Agent, or Firm* — Jeffrey D. Moy; Weiss & Moy, P.C.

(57) ABSTRACT

An electrical waveform generating circuit has a programmable current source-driver. A digital switched current source is coupled to the programmable current source-driver and controlled by waveforms stored in the programmable current source-driver. A plurality of MOSFETs is coupled to the programmable current source driver. A center-tapped RF transformer is provided and has a primary coupled to the plurality of high voltage MOSFETs. A transducer is coupled to a secondary of the RF transformer.

20 Claims, 4 Drawing Sheets

PROGRAMMABLE ULTRASOUND TRANSMIT BEAMFORMER INTEGRATED CIRCUIT AND METHOD

RELATED APPLICATIONS

The present provisional application is related to U.S. patent application entitled, "Ultrasound Transmit Beamformer Integrated Circuit and Method", Filed Feb. 15, 2007, and having U.S. Ser. No. 11/675,517 in the name of Lazar A. Shifrin. This patent application further claims the benefit of U.S. Provisional Application No. 61/073,850, filed Jun. 19, 2008, entitled "PROGRAMMABLE ULTRASOUND TRANSMIT BEAMFORMER INTEGRATED CIRCUIT AND METHOD" in the name of the same inventor, and which is incorporated herein by reference in its entirety.

FIELD OF THE INVENTION

This invention relates to a programmable ultrasound transmit beamformer waveform generator, and more particularly, to an ultrasound pulse waveform generator circuit and method with waveform and transmitting sequence control data memory for driving a piezoelectric transducer array probe for transmit beamforming and dynamic focusing.

BACKGROUND OF THE INVENTION

Ultrasound array transmitters in medical or nondestructive testing (NDT) imaging application have a growing demand for more sophisticated electrical excitation waveforms to generate well-focused, high resolution targeted, coherently formed, high frequency acoustic dynamic scanning beams. The conventional ultrasound transmit pulse generator circuits that can generate two different voltage amplitudes of bidirectional and return-to-zero pulses (such as a 5-level pulser) include at least six high-voltage high current MOSFET transistors in an output stage, such as described below in conjunction with FIG. 1. The cost per transmit channel of such pulsers compared to a 2-level or 3-level pulser increases dramatically.

Therefore, a need exists to provide a device and method to overcome the above problem.

SUMMARY

In accordance with one embodiment, an electrical waveform generating circuit has a programmable current source-driver. A digital switched current source is coupled to the programmable current source-driver and controlled by waveforms stored in the programmable current source-driver. A plurality of MOSFETs is coupled to the programmable current source driver. A center-tapped RF transformer is provided and has a primary coupled to the plurality of high voltage MOSFETs. A transducer is coupled to a secondary of the RF transformer The present invention will be more apparent from the following detailed description taken in conjunction with the accompanying drawings.

DETAILED DESCRIPTION

In various embodiments, the waveform generators of the present invention provide ultrasound imaging probe transducer excitation using a large number array of high voltage and high current transmit pulse waveform generators that may be controlled by a digital logic interface directly with fast response and precise timing. Electronics controlled dynamic focus, acoustic phase-array, and transmitting beamforming technology may be used in color Doppler image portable ultrasound machines. In various embodiments, the waveform generators of the present invention provide digital controlled, programmable high voltage waveform multiple generator channels that are integrated into very small ICs. In various embodiments, the waveform generators of the present invention may generate various transmitting waveforms, and include only two high current output stage MOSFETs.

Figure 1:
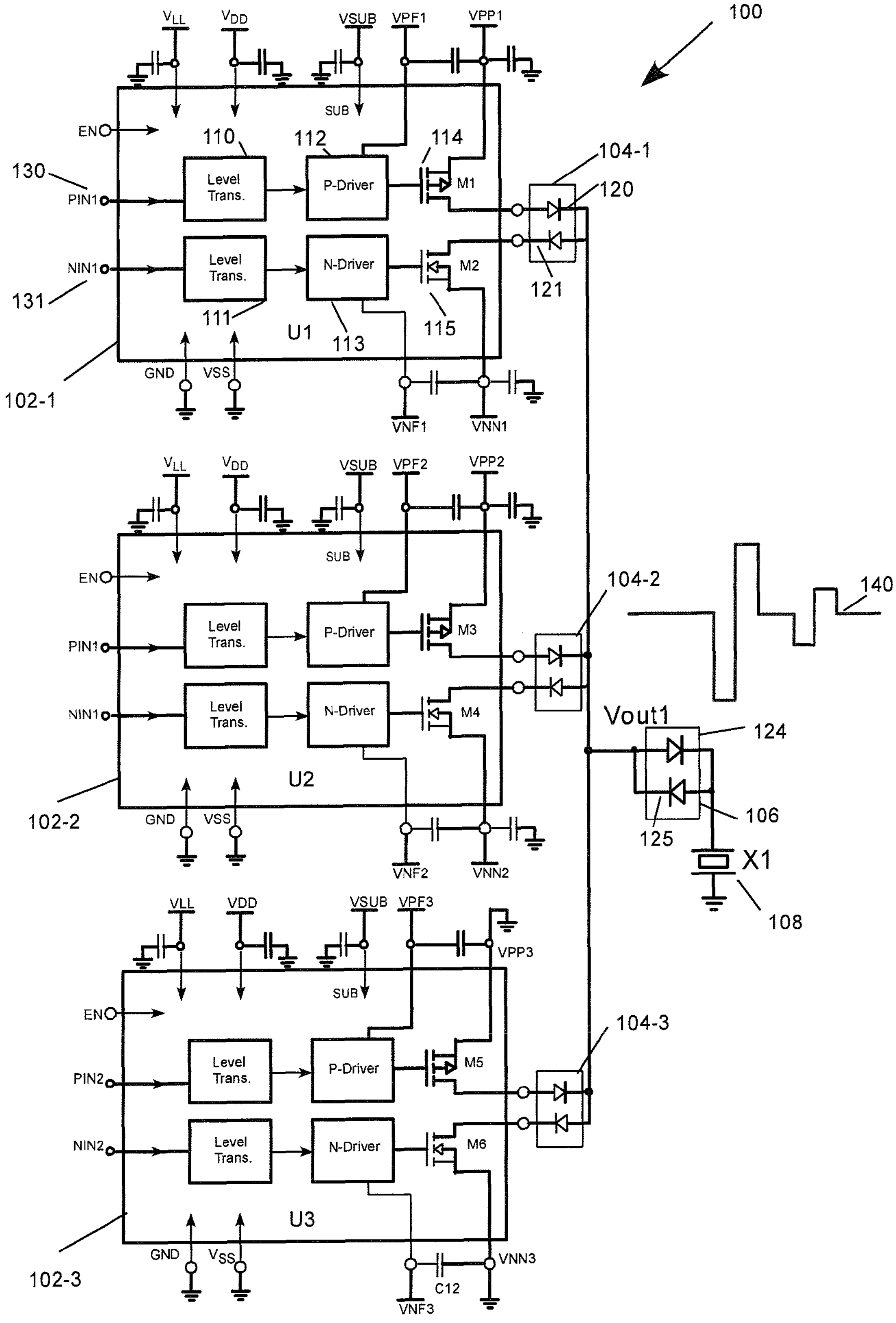
FIG. 1 is a schematic diagram illustrating a conventional 5-Level high voltage pulser.

Referring to FIG. 1, a schematic diagram illustrating a conventional 5-level high voltage pulser 100 with a return-to-zero (RTZ) function is shown. The pulser 100 generates a 5-level high voltage waveform 140. In the present embodiment, the pulser 100 uses a plurality of power amplifiers 102-1 through 102-3. Each power amplifier is coupled to a corresponding diode protection circuit 104-1 through 104-3. The output of each diode protection circuit 104-1 through 104-3 is coupled to a back-to-back cross coupled diode circuit 106. The back-to-back cross coupled diode circuit 106 is further coupled to a transducer 108.

Each of the power amplifiers 102-1 through 102-3 comprises a plurality of level translators 110 and 111. Each of the level translators is coupled to one of a P-driver 112 or an N-driver 113. A PMOS transistor 114 is coupled to the P-driver 112 and an NMOS transistor 115 is coupled to the N-driver 113. For simplicity and clarity, reference numbers are shown only in the power amplifier 102-1.

Each of the diode circuit 104-1 through 104-3 comprises a plurality of diodes 120 and 121. One of the diodes 120 is coupled to the PMOS transistors. The other diode 121 is coupled to the NMOS transistor. For simplicity and clarity, reference numbers are shown only in the diode circuit 104-1.

The cross coupled diode circuit 106 comprises a plurality of diodes 124 and 125 arranged in a cross coupled configuration with the anode of the diode 124 coupled to the cathode of the diode 125 and the cathode of the diode 124 being coupled to the anode of the diode 125. In accordance with one embodiment of the present invention, the transducer 108 may be an electroactive lens, or a piezoelectric element.

In operation, the level translator 110 shifts the voltage level of an input signal 130 and provides the level shifted signal to the P-driver 112. The P-driver 112 controls the gate of the PMOS transistor 114, which is arranged in a source follower power amplifier configuration between a voltage source VPP1 and the cathode of the diode 120 of the diode protection circuit 104. The PMOS transistor 114 and the NMOS transistor 115 are driven by the directly coupled MOSFET gate drivers 112 and 113, respectively. The PMOS transistor 112 provides the amplified signal through the diode 124 of the cross-coupled diode circuit 106 to the transducer 108.

The level translator 111 shifts the voltage level of an input signal 131 and provides the level shifted signal to the N-driver 113. The N-driver 113 controls the gate of the NMOS transistor 114, which is arranged in a source follower power amplifier configuration between the anode of the diode 121 of the diode protection circuit 121 and a negative voltage source VNN1. The NMOS transistor 114 receives amplified signal through the diode 125 of the cross-coupled diode circuit 106 from the transducer 108.

Figure 2:
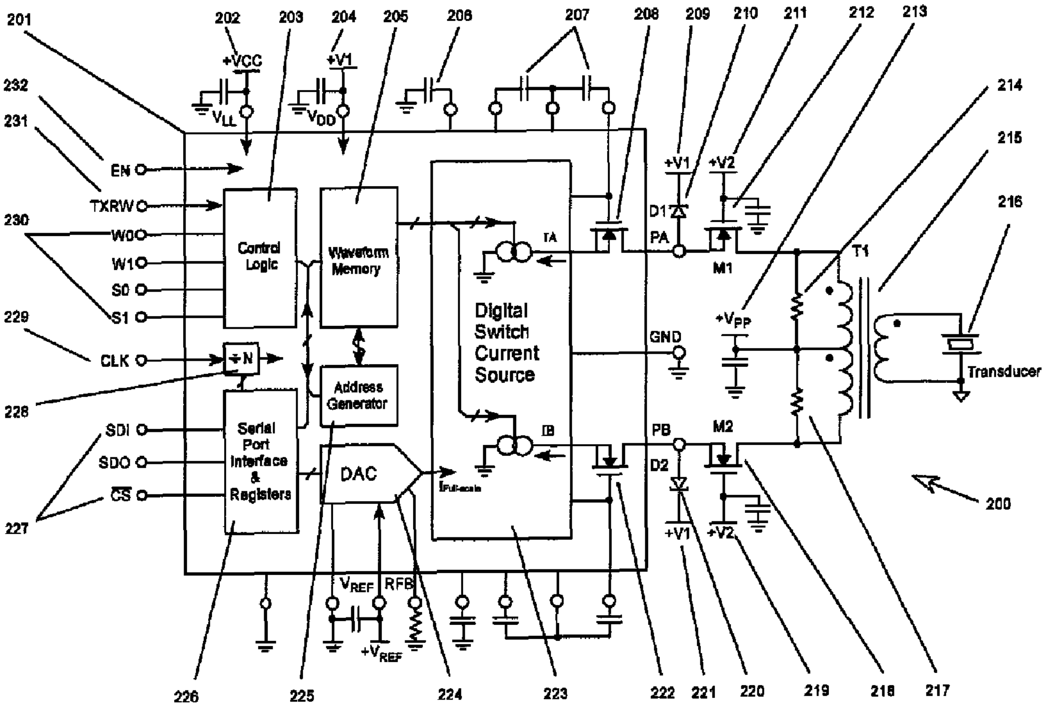
FIG. 2 is a schematic diagram illustrating a high voltage waveform generator circuit that includes a push-pull source-driving current-source pulse amplitude modulation and voltage amplifier stage for ultrasound transmit excitation applications in accordance with the present invention.

Referring now to FIG. 2, a schematic block diagram illustrating a waveform generator circuit 200 of the present invention is shown. The circuit 200 has a source-driver and control circuit 201. In accordance with the present embodiment, the source-driver and control circuit 201 may have control logic 203, waveform memory 205, address generator 225, transmitting frequency pre-scale 228, serial port interface 226, and a DAC 224.

A switching current control circuit 223 is coupled to the source-driver and control circuit 201. Two push-pull output MOSFETs circuit 208 and 222 are coupled to the switching current control circuit 223. A protection diode 210 and 220 are connected to the push-pull output MOSFETs circuit 208 and 222 respectively and to a voltage source 209 and 221 respectively which have the same or higher voltage as VDD voltage 204. The drain of each push-pull output MOSFET circuit 208 and 222 are driving the high voltage N type MOSFETs 212 and 218 source pins respectively. The gates of the high voltage N type MOSFETs 212 and 218 are grounded for AC point of view but connected to a voltage +V2 of 211 and 219 as DC bias voltage.

The bias voltage of 211 and 219 and the gate threshold have been selected such when PA and PB are off same voltage as +V1, that the high voltage N type MOSFETs 212 and 218 will be also turned off, when voltage of PA and PB are low to reasonable level the current of the high voltage N type MOSFETs 212 and 218 can be predetermined value as the maximum.

The current of the maximum to zero level may be linearly or almost linearly controlled by the digital switch current source 223 and the full-scale current DAC 224 settings. The digital current source is controlled by the waveform memory 205. The waveform memory 205 can be read and write accessed via the serial port interface 226 via the input pins 227, including serial data input, serial data output and select control etc pins.

The clock pin 229 of the circuit is shared for the serial interface and data transmitting operation. There is memory and control registers in the serial port interface 226 circuit. The memory and control registers may be used for storing all the programmable features such as setting start address on the address generator 225, length of the waveform data set, transmitting frequency pre-scale 228 (clock frequency divide-by-N) and number of repeating transmitting loops or infinite times (CW) mode, the polarity of the output swapping and time-symmetric waveform memory address fast-reverse function to save half of the waveform data points etc.

The high voltage N type MOSFETs 212 and 218 drains are connected to a center tapped RF current transformer 215. The secondary of the RF current transformer 215 is connected to the load piezoelectric or capacitive ultrasound transducer 216. The RF current transformer 215 not only serves as push-pull differential-to-single-end RF converter, but also performs the work output impedance matching component. The center tap of the RF current transform 215 is connected to the high voltage power supply 213. Two resistors 214 and 217 are parallel with the primarily of the RF current transformer 215 as the damper resistors to absorb the energy in the winding leakage inductance of the RF current transformer 215.

The DAC 224 is used for setting up the full-scale current of both digital switch control current in the digital switch current source 223. There is an external pin for the input of the DAC reference voltage +VREF. Besides the de-coupling capacitors 235-237 for each of the power supply voltages, there are additional de-coupling capacitors and the by pass capacitors 206, 207 on the both side of push and pull circuits for the DAC 224 and it's reference, constant current control loop and bias circuit.

In accordance with one embodiment of the present invention, The voltage supply of the circuit +V1=+5V, +V2=VCC=+3.3V and VPP=+70V to +100V fixed power supply typically.

Figure 3:
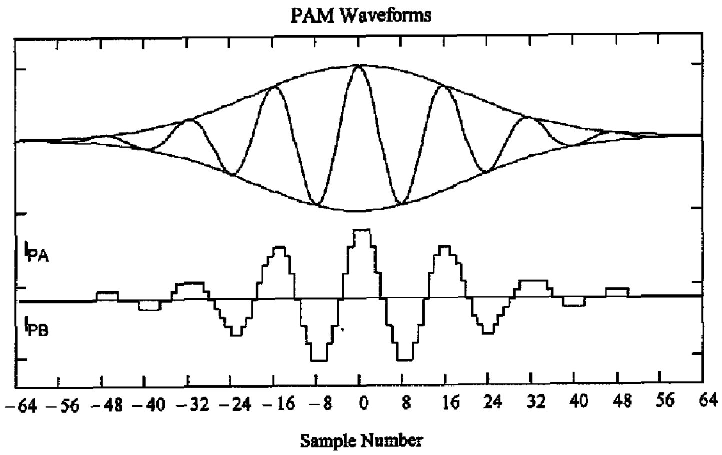
FIG. 3 is a graph showing PAM waveforms.

Referring to FIG. 3, a sample waveform of the circuit depicted in FIG. 2 is shown.

Figure 4:
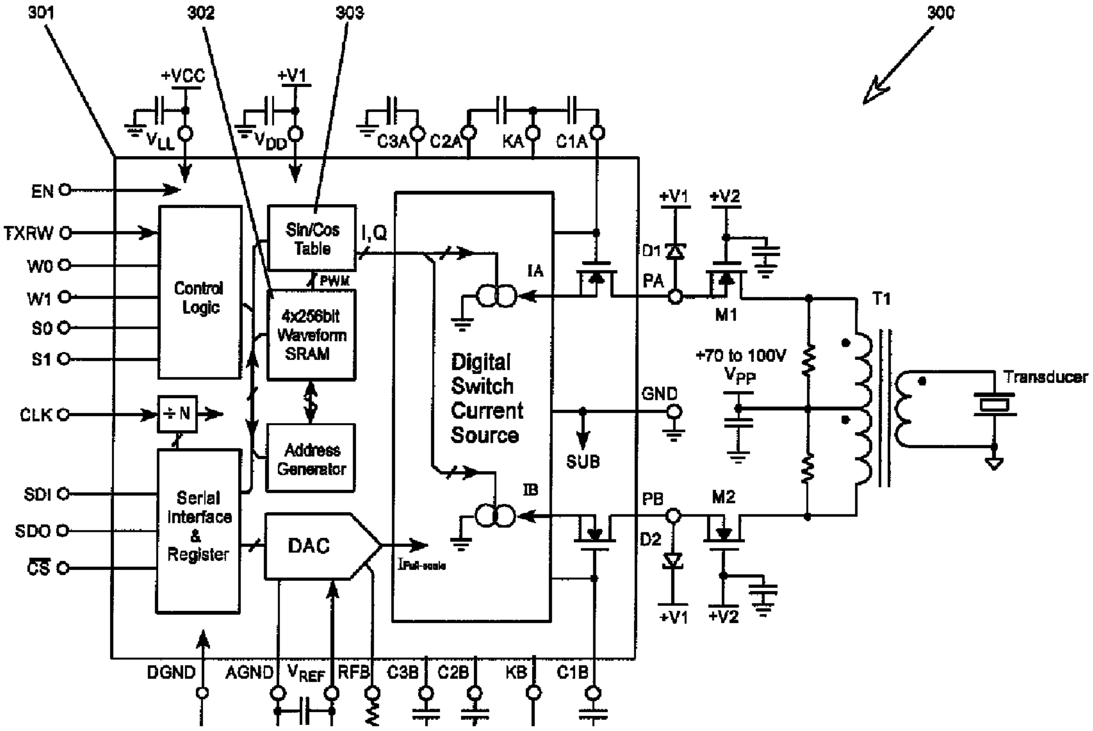
FIG. 4 is a schematic diagram illustrating a waveform generator circuit including a push-pull source-driving current-source pulse amplitude and width modulations, vector angle lookup table and voltage amplifier stage configuration in accordance with another embodiment of the present invention.

Referring to FIG. 4, another embodiment of the waveform generator circuit 300 of the present invention is shown. The waveform generator circuit 300 is a PWM version. In the present embodiment, the waveform generator 300 replaces the waveform memory 205 of FIG. 2 with a sine-cosine look-up table 303 and 4-bit width PWM control data memory 302 which is used for storing PWM waveforms.

Figure 5:
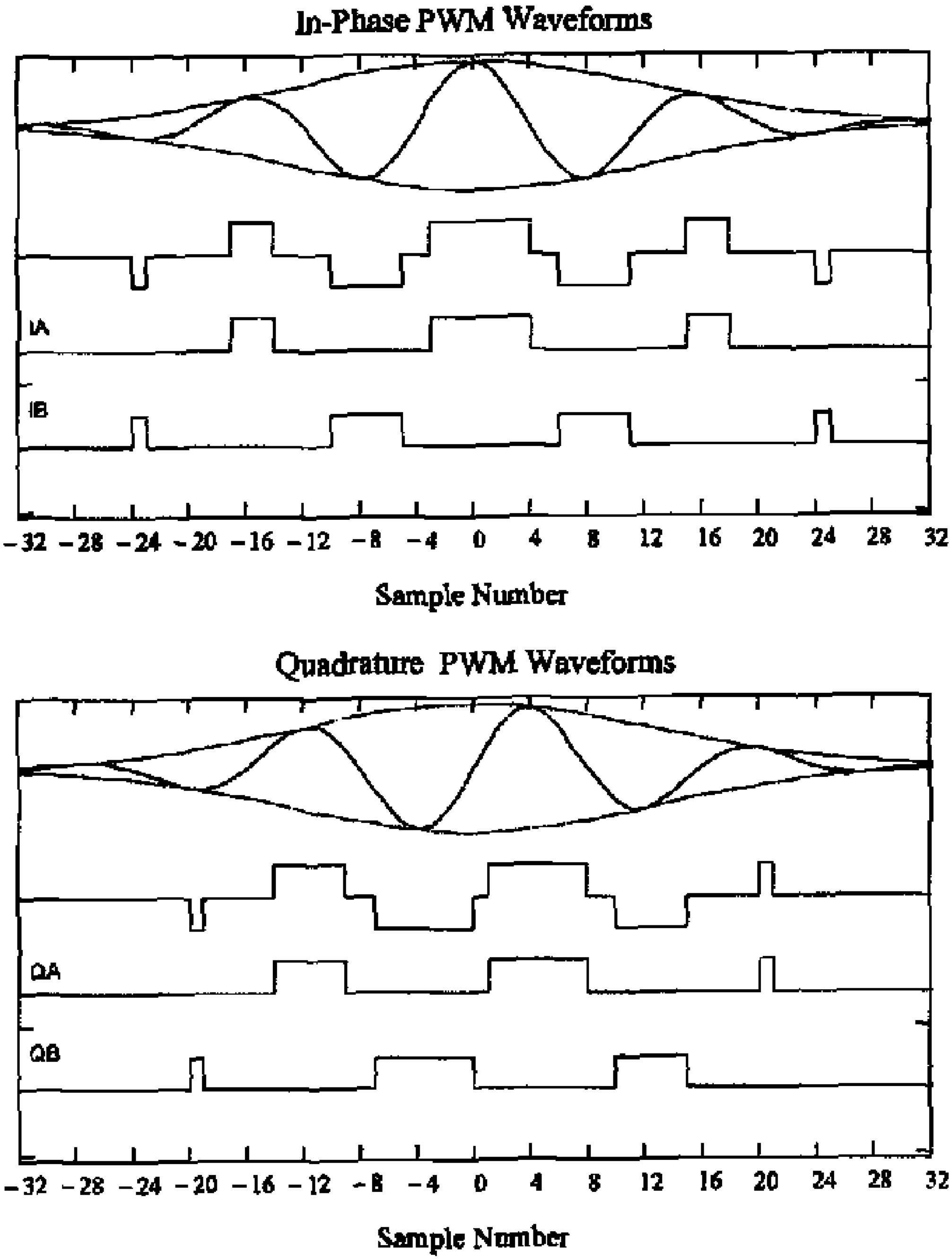
FIG. 5 is a graph showing a typical waveform of Gaussian sine wave to generated by IA, QA, IB, QB PWM signals.

Referring to FIG. 5, the waveform that typical waveform of Gaussian sine wave to generated by IA, QA, ID, QB PWM signals is shown.

This disclosure provides exemplary embodiments of the present invention. The scope of the present invention is not limited by these exemplary embodiments. Numerous variations, whether explicitly provided for by the specification or implied by the specification, such as variations in structure, dimension, type of material and manufacturing process, may be implemented by one skilled in the art in view of this disclosure.

What is claimed is:

1. An electrical waveform generating circuit comprising:

a programmable current source-driver;

a digital switched current source coupled to the programmable current source-driver and controlled by waveforms stored in the programmable current source-driver;

a plurality of MOSFETs coupled to the programmable current source driver;

a center-tapped RF transformer having a primary coupled to the plurality of high voltage MOSFETs;

a transducer coupled to a secondary of the RF transformer.

2. An electrical waveform generating circuit in accordance with claim 1 wherein the plurality of high voltage MOSFETs comprises:

a first pair of MOSFETS, wherein source terminals of each of the first pair of MOSFETS is coupled to the digital switched current source;

a second pair of MOSFETS, wherein the drain terminals of the first pair of MOSFETS are driving the source terminals of the second pair of MOSFETS, the gate terminals of the second pair of MOSFETS grounded for AC point of view and connected to a MOSFET voltage supply.

3. An electrical waveform generating circuit in accordance with claim 2 further comprising a pair of protection diodes, wherein the pair of protection diodes is coupled between the first pair of MOSFETs and the second pair of MOSFETs.

4. An electrical waveform generating circuit in accordance with claim 1 wherein the programmable current source-driver comprises:

a waveform memory coupled to the digital switched current source to control the switching current control circuit;

a digital to analog converter (DAC) coupled to the digital switched current source for setting-up full scale currents of the digital switched current source; and a waveform memory which controls the switching current control circuit and can be read and write accessed via the plurality of pins of the serial port interface.

5. An electrical waveform generating circuit in accordance with claim 4 wherein the programmable current source-driver further comprises:

a serial port interface coupled DAC and the waveform generator to read and write data to the waveform memory;

control logic coupled to the serial port interface and the waveform memory; and an address generator coupled to the serial port interface, to the control logic and to the waveform memory.

6. An electrical waveform generating circuit in accordance with claim 5 wherein the serial port interface has control registers for storing programmable features.

7. An electrical waveform generating circuit in accordance with claim 5 further comprising a transmitting frequency pre-scale being coupled to the serial port interface.

8. An electrical waveform generating circuit in accordance with claim 5 further wherein the diodes are Schottky type of fast reverse recovery diodes connected at a source driver output to power supply voltage rail to protect the output device of the source driver.

9. An electrical waveform generating circuit in accordance with claim 4 wherein the waveform memory comprises:

a sine-cosine look-up table coupled to the digital switched current source; and a PWM control data memory coupled to the sine-cosine look-up table.

10. An electrical waveform generating circuit in accordance with claim 5 wherein the waveform memory comprises:

a sine-cosine look-up table coupled to the digital switched current source; and a PWM control data memory coupled to the sine-cosine look-up table, the address generator, the serial port interface and the control logic.

11. An electrical waveform generating circuit in accordance with claim 1 further comprising a pair of resistive elements in parallel with the primarily of the transformer to absorb energy in a winding leakage inductance of the transformer.

12. An electrical waveform generating circuit in accordance with claim 1 further comprising a plurality of de-coupling capacitors, at least one de-coupling capacitor coupled to each power supply voltage in the electrical waveform generating circuit.

13. An electrical waveform generating circuit in accordance with claim 1 further comprising bypass capacitors coupled to the plurality of MOSFETS.

14. An electrical waveform generating circuit comprising:

a programmable current source-driver;

a digital switched current source coupled to the programmable current source-driver and controlled by waveforms stored in the programmable current source-driver;

a first pair of MOSFETS, wherein source terminals of each of the first pair of MOSFETS is coupled to the digital switched current source;

a second pair of MOSFETS, wherein the drain terminals of the first pair of MOSFETS are driving the source terminals of the second pair of MOSFETS, the gate terminals of the second pair of MOSFETS grounded for AC point of view and connected to a MOSFET voltage supply;

a pair of protection diodes, wherein the pair of protection diodes is coupled between the first pair of MOSFETs and the second pair of MOSFETs;

a center-tapped RF transformer having a primary coupled to the second pair of MOSFETs;

a transducer coupled to a secondary of the RF transformer.

15. An electrical waveform generating circuit in accordance with claim 14 wherein the programmable current source-driver comprises:

a waveform memory coupled to the digital switched current source to control the switching current control circuit;

a digital to analog converter (DAC) coupled to the digital switched current source for setting-up full scale currents of the digital switched current source; and a waveform memory which controls the switching current control circuit and can be read and write accessed via the plurality of pins of the serial port interface.

16. An electrical waveform generating circuit in accordance with claim 15 wherein the programmable current source-driver further comprises:

a serial port interface coupled DAC and the waveform generator to read and write data to the waveform memory;

control logic coupled to the serial port interface and the waveform memory; and an address generator coupled to the serial port interface, to the control logic and to the waveform memory.

17. An electrical waveform generating circuit in accordance with claim 16 further comprising a transmitting frequency pre-scale being coupled to the serial port interface.

18. An electrical waveform generating circuit in accordance with claim 15 wherein the waveform memory comprises:

a sine-cosine look-up table coupled to the digital switched current source; and a PWM control data memory coupled to the sine-cosine look-up table.

19. An electrical waveform generating circuit in accordance with claim 16 wherein the waveform memory comprises:

a sine-cosine look-up table coupled to the digital switched current source; and a PWM control data memory coupled to the sine-cosine look-up table, the address generator, the serial port interface and the control logic.

20. An electrical waveform generating circuit in accordance with claim 14 further comprising a pair of resistive elements in parallel with the primarily of the transformer to absorb energy in a winding leakage inductance of the transformer.

* * * * *